US009922820B2

(12) United States Patent
Fukiage et al.

(10) Patent No.: US 9,922,820 B2
(45) Date of Patent: Mar. 20, 2018

(54) FILM FORMING METHOD AND FILM FORMING APPARATUS

(71) Applicant: TOKYO ELECTRON LIMITED, Tokyo (JP)

(72) Inventors: Noriaki Fukiage, Nirasaki (JP); Takayuki Karakawa, Nirasaki (JP); Toyohiro Kamada, Nirasaki (JP); Akihiro Kuribayashi, Nirasaki (JP); Takeshi Oyama, Nirasaki (JP); Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/420,579

(22) Filed: Jan. 31, 2017

(65) Prior Publication Data

US 2017/0221703 A1 Aug. 3, 2017

(30) Foreign Application Priority Data

Feb. 2, 2016 (JP) .................... 2016-018292

(51) Int. Cl.
*H01L 21/02* (2006.01)
*C23C 8/34* (2006.01)
*H01J 37/32* (2006.01)
*H01L 21/687* (2006.01)

(52) U.S. Cl.
CPC .......... *H01L 21/02277* (2013.01); *C23C 8/34* (2013.01); *H01J 37/3244* (2013.01); *H01J 37/32201* (2013.01); *H01J 37/32458* (2013.01); *H01J 37/32715* (2013.01);
(Continued)

(58) Field of Classification Search
CPC . H01L 22/14; H01L 21/0262; H01L 21/0228; H01L 21/0217; H01L 21/02274; H01L 21/02211; H01L 21/3185; H01L 21/76846; H01L 21/02123; C23C 16/45544; C23C 16/45536; C23C 16/505; C23C 16/52; H01J 37/32935; H01J 37/32183; H01J 2237/3321
See application file for complete search history.

(56) References Cited

U.S. PATENT DOCUMENTS

2011/0129619 A1* 6/2011 Matsunaga ........... C23C 16/345
427/579

FOREIGN PATENT DOCUMENTS

WO 2013137115 A1 9/2013

* cited by examiner

*Primary Examiner* — Roy Potter
(74) *Attorney, Agent, or Firm* — Nath, Goldberg & Meyer; Jerald L. Meyer

(57) ABSTRACT

A method of forming a silicon nitride film on a substrate in a vacuum vessel, includes forming the silicon nitride film by depositing a layer of reaction product by repeating a cycle a plurality of times. The cycle includes a first process of supplying a gas of a silicon raw material to the substrate to adsorb the silicon raw material to the substrate, subsequently, a second process of supplying a gas of ammonia in a non-plasma state to the substrate to physically adsorb the gas of the ammonia to the substrate, and subsequently, a third process of supplying active species obtained by converting a plasma forming gas containing a hydrogen gas for forming plasma into plasma to the substrate and causing the ammonia physically adsorbed to the substrate to react with the silicon raw material to form the layer of reaction product.

4 Claims, 14 Drawing Sheets

(52) U.S. Cl.
CPC ...... *H01L 21/0217* (2013.01); *H01L 21/0228* (2013.01); *H01L 21/68764* (2013.01); *H01J 2237/332* (2013.01)

FILM FORMING METHOD AND FILM FORMING APPARATUS

CROSS-REFERENCE TO RELATED APPLICATION

This application claims the benefit of Japanese Patent Application No. 2016-018292, filed on Feb. 2, 2016, in the Japan Patent Office, the disclosure of which is incorporated herein in its entirety by reference.

TECHNICAL FIELD

The present disclosure relates to a film forming method and a film forming apparatus for forming a silicon nitride film on a substrate.

BACKGROUND

In a semiconductor manufacturing process, there may be a case where a film forming process of forming a silicon nitride (SiN) film on a substrate is performed so as to cover an underlying film on which a pattern such as a hole, a groove or the like is formed. Conventionally, a film forming apparatus for forming an SiN film in this way has been known. According to this film forming apparatus, the SiN film is formed on the substrate by allowing the substrate loaded on a rotary table to alternately repeatedly pass through a region to which a raw material gas containing silicon is supplied and a region to which a nitriding gas for nitriding the raw material gas is converted into plasma and supplied by rotation of the rotary table.

Meanwhile, for example, a carbon film using carbon as a main component, which is referred to as an SOC film, is often used as the underlying film. However, in a case where the underlying film is the carbon film as described above, when the processing is performed by using an ammonia ($NH_3$) gas as the nitriding gas and converting the $NH_3$ gas into plasma, the carbon film may be relatively greatly etched, leading to film loss (reduction in film thickness). In order to prevent such etching, it is considered that the processing is performed using a nitrogen ($N_2$) gas converted into plasma, instead of the $NH_3$ gas converted into plasma. However, since active species obtained by converting the $N_2$ gas into plasma are relatively quickly deactivated, there is a possibility that most of the active species does not reach a lower side of hole and groove of the carbon film. In this case, in the SiN film formed on a sidewall of the carbon film on which a pattern is formed, a film thickness of the lower side of the sidewall may be smaller than a film thickness of an upper side of the sidewall. Thus, it was difficult to obtain desirable step coverage in forming the SiN film on the carbon film on which a pattern is formed.

SUMMARY

Some embodiments of the present disclosure provide a technique of forming a silicon nitride film with a good film quality, which enable high coverage with respect to a surface of a substrate can be secured and suppress damage to the surface of the substrate.

According to one embodiment of the present disclosure, there is provided a method of forming a silicon nitride film on a substrate in a vacuum vessel, including: forming the silicon nitride film by depositing a layer of reaction product by repeating a cycle a plurality of times, the cycle including: a first process of supplying a gas of a silicon raw material to the substrate to adsorb the silicon raw material to the substrate; subsequently, a second process of supplying a gas of ammonia in a non-plasma state to the substrate to physically adsorb the gas of the ammonia to the substrate; and subsequently, a third process of supplying active species obtained by converting a plasma forming gas containing a hydrogen gas for forming plasma into plasma to the substrate and causing the ammonia physically adsorbed to the substrate to react with the silicon raw material to form the layer of reaction product.

According to one embodiment of the present disclosure, there is provided an apparatus for forming a silicon nitride film on a substrate, including: a rotary table installed in a vacuum vessel and configured to revolve the substrate; a first processing part configured to supply a silicon raw material gas to a passing region of the substrate above the rotary table; a second processing part located at a downstream side of the first processing part in a rotational direction of the rotary table and separated from the first processing part in order to suppress gases from being mixed, and configured to supply an ammonia gas in a non-plasma state to the passing region of the substrate to physically adsorb the ammonia gas to the substrate; and a third processing part located at a downstream side of the second processing part in a rotational direction of the rotary table and separated from the first processing part in order to suppress gases from being mixed, and configured to supply active species obtained by converting a plasma forming gas containing a hydrogen gas for forming plasma into plasma to the passing region of the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
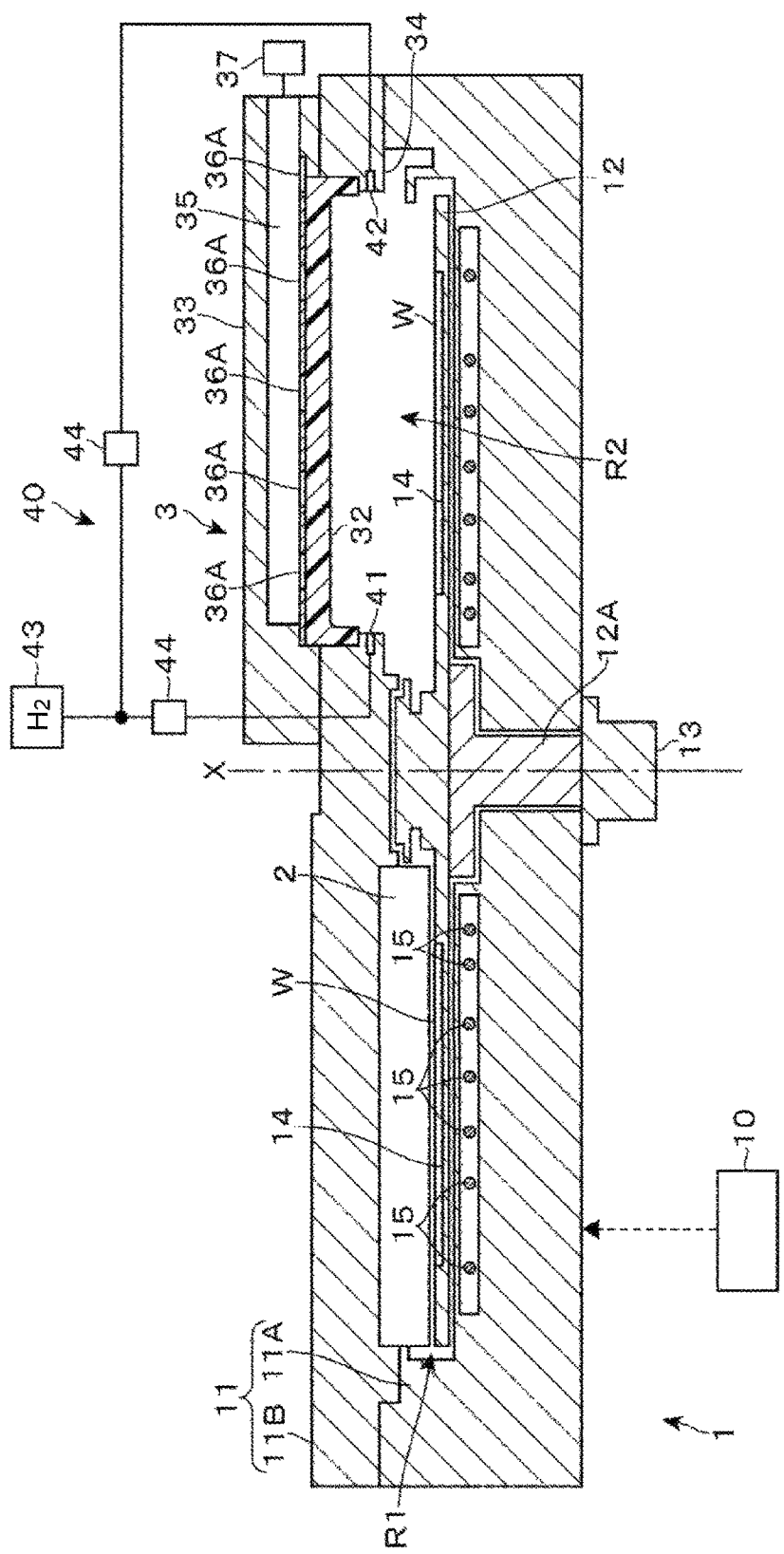
FIG. 1 is a schematic longitudinal side view of a film forming apparatus for performing a film forming method of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 according to an embodiment of the present disclosure will be described with reference to a longitudinal side view of FIG. 1 and a transverse plane view of FIG. 2. In the film forming apparatus 1, a SiN film is formed on a surface of a semiconductor wafer (hereinafter, referred to as "wafer") W as a substrate by an atomic layer deposition (ALD) method. Further, in the present disclosure, a silicon nitride will be referred to as SiN, regardless of the stoichiometric ratio of Si and N. Thus, the reference to SiN includes, for example, $Si_3N_4$.

In the drawing, reference numeral 11 denotes a flat, substantially circular vacuum vessel (process vessel) configured by a vessel body 11A forming a sidewall and a bottom portion and an upper plate 11B. In the drawing, reference numeral 12 denotes a circular rotary table horizontally installed in the vacuum vessel 11. In the drawing, reference numeral 12A denotes a support portion supporting the central portion of the rear surface of the rotary table 12. In the drawing, reference numeral 13 is a rotation mechanism which rotates the rotary table 12 in a clockwise direction in a plane view in its circumferential direction through the support portion 12A during a film forming process. In the drawing, reference symbol X indicates a rotational axis of the rotary table 12.

Five circular concave portions 14 are installed in a circumferential direction (rotational direction) of the rotary table 12 on an upper surface of the rotary table 12, and wafers W are received in the respective concave portions 14. That is, each wafer W is loaded on the rotary table 12 such that each wafer W is revolved by rotation of the rotary table 12. In FIG. 1, reference numeral 15 denotes a plurality of heaters which is installed in a concentric manner in the bottom portion of the vacuum vessel 11 to heat the wafers W loaded on the rotary table 12. In FIG. 2, reference numeral 16 denotes a transfer port of the wafers W which is opened through the sidewall of the vacuum vessel 11 and configured to be opened and closed by a gate valve (not shown). Using a substrate transfer mechanism (not shown), the wafers W are transferred between the exterior of the vacuum vessel 11 and the interior of the concave portions 14 through the transfer port 16.

A gas supply and exhaust unit 2, a plasma forming unit 3, and a gas supply unit 4A are installed on the rotary table 12 in this order toward an upstream side of the rotary table 12 in the rotational direction. Further, reference numeral 4B indicated by the dotted line in FIG. 2 denotes a gas supply unit mounted on a testing device for performing evaluation tests as described herein below. A configuration of the gas supply unit 4B will be described herein below. Although the gas supply unit 4B is not installed in the film forming apparatus 1 described in an embodiment of the present disclosure, but the gas supply unit 4B may be installed.

Hereinafter, the gas supply and exhaust unit 2 will be described with reference to FIG. 3 which is a longitudinal side view and FIG. 4 which is a bottom view. The gas supply and exhaust unit 2 is formed in a fan shape that widens in the circumferential direction of the rotary table 12 from the central side of the rotary table 12 to the peripheral side thereof in the plane view. A lower surface of the gas supply and exhaust unit 2 is close to and faces the upper surface of the rotary table 12.

Raw material gas discharge ports 21, an exhaust port 22, and a purge gas discharge port 23 are opened on the lower surface of the gas supply and exhaust unit 2. The plurality of raw material gas discharge ports 21 is distributed in plural places in a fan-shaped region 24 positioned inward of a peripheral portion of the lower surface of the gas supply and exhaust unit 2. The raw material gas discharge port 21 discharges a dichlorosilane (DCS) gas, which is a raw material gas containing silicon (Si) for forming an SiN film, downwardly in a shower form to supply the gas to the entire surface of the wafer W, while the rotary table 12 rotates during the film forming process. Further, the raw material gas is not limited to the DCS, and for example, hexachlorodisilane (HCD) may also be used.

In the fan-shaped region 24, three zones 24A, 24B, and 24C are set from the central side of the rotary table 12 toward the peripheral side of the rotary table 12, and gas flow passages 25A, 25B, and 25C, which are partitioned from one another, are provided in the gas supply and exhaust unit 2 so as to independently supply the DCS gas to the raw material gas discharge ports 21 formed in the zone 24A, the raw material gas discharge ports 21 formed in the zone 24B, and the raw material gas discharge ports 21 formed in the zone 24C. A downstream end of each of the gas flow passages 25A, 25B, and 25C is configured as the raw material gas discharge ports 21.

Further, an upstream side of each of the gas flow passages 25A, 25B, and 25C is connected to a DCS gas supply source 26 via each pipe, and a gas supply device 27 configured by a valve and a mass flow controller is installed in each pipe. The supply and stop and flow rate of the DCS gas supplied from the DCS gas supply source 26 to each of the gas flow passages 25A, 25B, and 25C are controlled by the gas supply device 27. Also, each gas supply device other than the gas supply device 27, which will be described herein below, may be configured in the same manner as that of the gas supply device 27 to control the supply and stop and flow rate of the gas to the downstream side.

Next, each of the exhaust port 22 and the purge gas discharge port 23 will be described. In order to facilitate understanding of the drawing, the exhaust port 22 and the purge gas discharge port 23 are illustrated by adding a plurality of dots in FIG. 4. The exhaust port 22 and the purge gas discharge port 23 are annularly opened on the peripheral portion of the lower surface of the gas supply and exhaust unit 2 to surround the fan-shaped region 24 and face the upper surface of the rotary table 12. The purge gas discharge port 23 is located outside the exhaust port 22. An inner region of the exhaust port 22 on the rotary table 12 forms a raw material gas adsorption region R1 as a first processing part in which DCS is adsorbed to the surface of the wafer W. The purge gas discharge port 23 discharges an argon (Ar) gas as a purge gas onto the rotary table 12. Nitriding is performed in a plasma forming region R2 outside the adsorption region R1, which will be described herein below. In order to enhance the controllability of nitriding, it is desirable that a gas not containing a nitrogen (N) component such as the Ar gas be used as a purge gas for separating the adsorption region R1 and the plasma forming region R2.

During the film forming process, the operation of discharging a raw material gas from the raw material gas discharge ports 21, exhaust from the exhaust port 22, and the operation of discharging a purge gas from the purge gas discharge port 23 are performed together. Thus, as indicated by the arrow in FIG. 3, the raw material gas and the purge gas discharged toward the rotary table 12 are oriented toward the exhaust port 22 from the upper surface of the rotary table 12 and are exhausted from the exhaust port 22. As the purge gas is discharged and exhausted in this manner, the atmosphere of the raw material gas adsorption region R1 is separated from the ambient atmosphere and the raw material gas may be limitedly supplied to the raw material gas adsorption region R1. That is, since the DCS gas supplied to the raw material gas adsorption region R1 can be suppressed from being mixed with each gas supplied to the outside of the raw material gas adsorption region R1 by the plasma forming unit 3 and the gas supply unit 4A as described herein below, and active species of the gas, the film forming process can be performed on the wafer W by ALD method as described herein below. In addition, the purge gas has a function to remove the DCS gas excessively adsorbed to the wafer W from the wafer W, as well as a function of separating the atmosphere as described above.

Figure 3:
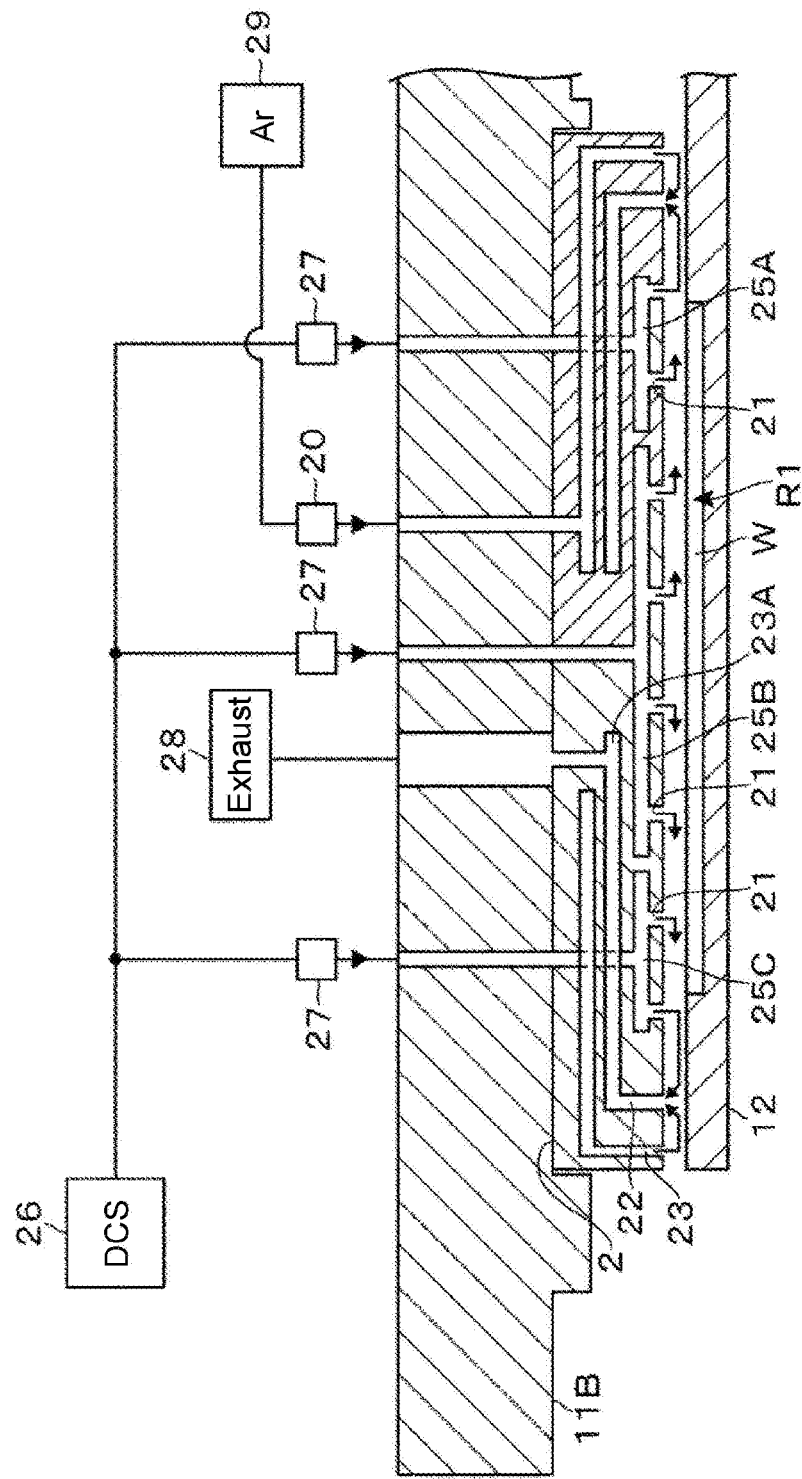
FIG. 3 is a longitudinal side view of a gas supply and exhaust unit installed in the film forming apparatus.
Figure 4:
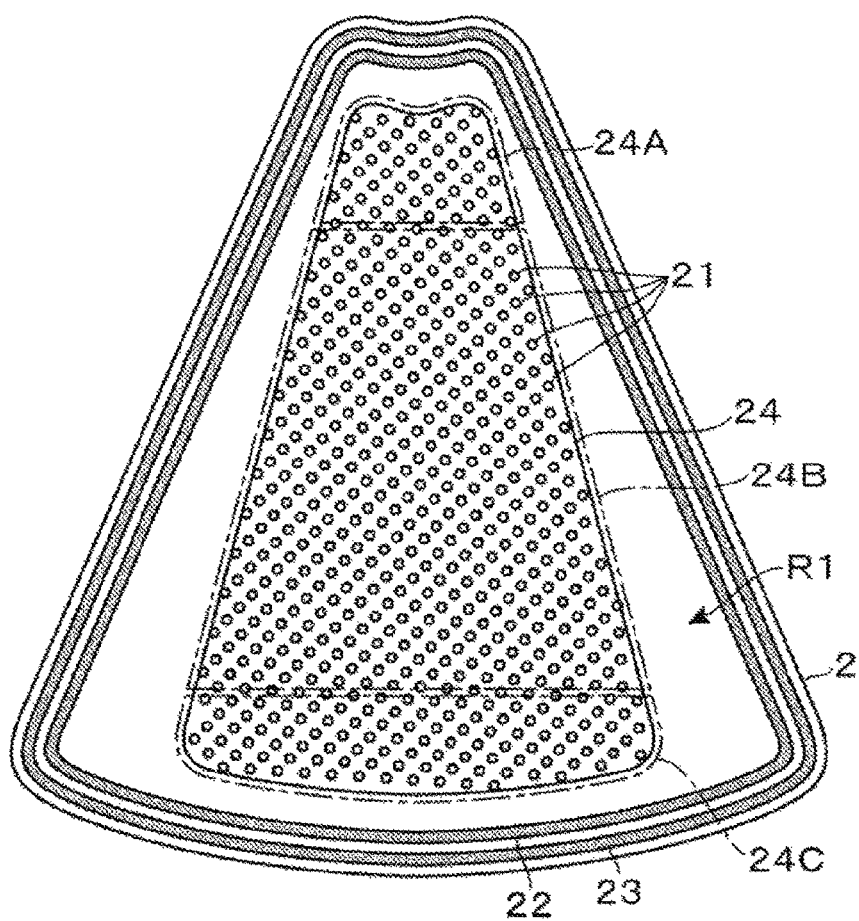
FIG. 4 is a bottom view of the gas supply and exhaust unit.

In FIG. 3, reference numerals 23A and 24A denote gas flow passages which are partitioned from each other and are formed in the gas supply and exhaust unit 2, and each of them is also partitioned from the raw material gas flow passages 25A to 25C. An upstream end of the gas flow passage 23A is connected to the exhaust port 22. A downstream end of the gas flow passage 23A is connected to an exhaust device 28, and exhaust may be performed from the exhaust port 22 by the exhaust device 28. Further, a downstream end of the gas flow passage 24A is connected to the purge gas discharge port 23, and an upstream end of the gas flow passage 24A is connected to an Ar gas supply source 29. A gas supply device 20 is disposed in a pipe connecting the gas flow passage 24A and the Ar gas supply source 29.

Subsequently, the plasma forming unit 3 will be described with reference to FIG. 1. The plasma forming unit 3 supplies a plasma forming gas to the rotary table 12 and supplies microwaves to the plasma forming gas to generate plasma above the rotary table 12. The plasma forming unit 3 has an antenna 31 for supplying the microwave, and the antenna 31 includes a dielectric plate 32 and a metal waveguide 33.

The dielectric plate 32 is formed in a substantially fan shape that widens from the central side of the rotary table 12 toward the peripheral side thereof in a plane view. A through hole having a substantially fan shape is formed in the upper plate 11B of the vacuum vessel 11 to correspond to the shape of the dielectric plate 32, and an inner peripheral surface of a lower end portion of the through hole slightly protrudes from a central portion of the through hole and forms a support portion 34. The dielectric plate 32 is installed to close the through hole from above and face the rotary table 12, and the peripheral portion of the dielectric plate 32 is supported by the support portion 34.

The waveguide 33 is installed on the dielectric plate 32 and has an inner space 35 that extends along a radial direction of the rotary table 12. In the drawing, reference numeral 36 denotes a slot plate which forms a lower side of the waveguide 33. The slot plate 36 is installed to make contact with the dielectric plate 32, and has a plurality of slot holes 36A. An end portion of the waveguide 33 at the central side of the rotary table 12 is closed, and a microwave generator 37 is connected to an end portion thereof at the peripheral portion side of the rotary table 12. The microwave generator 37 supplies microwaves of, for example, about 2.45 GHz to the waveguide 33.

Further, the plasma forming unit 3 has a first gas discharge port 41 and a second gas discharge port 42 which supply the plasma forming gas to a lower surface side of the dielectric plate 32. These gas discharge ports 41 and 42 are formed in plural places in the support portion 34 of the dielectric plate 32, for example, in the circumferential direction of the vacuum vessel 11. The first gas discharge port 41 discharges the plasma forming gas from the central side of the rotary table 12 toward the peripheral portion side thereof, and the second gas discharge port 42 discharges the plasma forming gas from the peripheral portion side of the rotary table 12 toward the central side thereof. The microwave supplied to the waveguide 33 reaches the dielectric plate 32 through the slot holes 36A of the slot plate 36 and is supplied to the plasma forming gas discharged to a lower side of the dielectric plate 32 to limitedly form plasma in a lower region of the dielectric plate 32. The region in which plasma is formed forms a third processing part as indicated with R2 in FIG. 2.

Further, a hydrogen ($H_2$) gas is used as the plasma forming gas. In the drawing, reference numeral 43 is an $H_2$ gas supply source, and the first gas discharge port 41 and the second gas discharge port 42 are connected to the $H_2$ gas supply source 43 via a piping system 40 having a gas supply device 44. The piping system 40 is configured to control the supply and stop and flow rate of the $H_2$ gas to each of the gas discharge ports 41 and 42 from the gas supply source 43.

Figure 5:
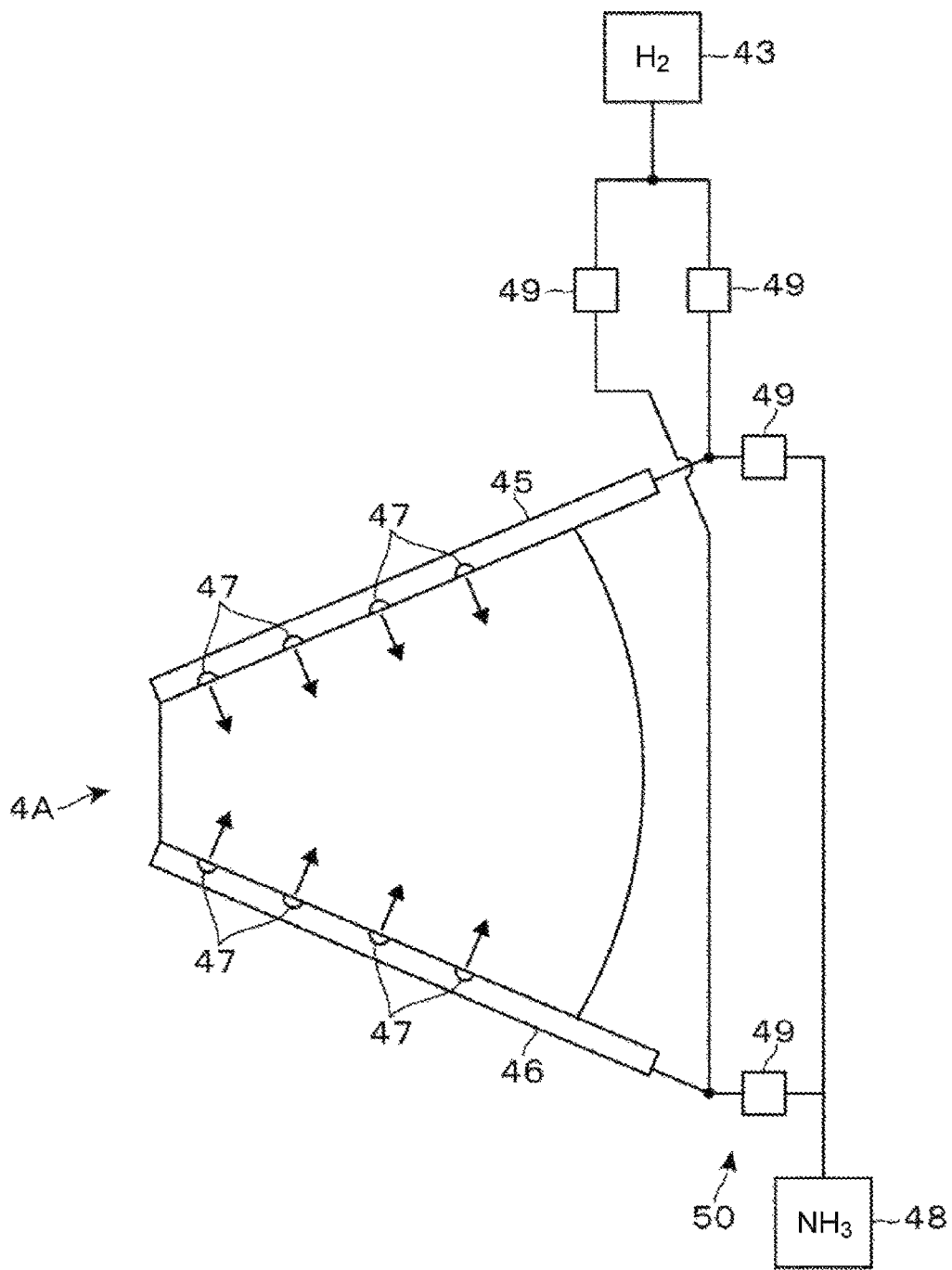
FIG. 5 is a schematic view of a gas supply unit installed in the film forming apparatus.

Subsequently, the gas supply unit 4A will be described with reference to FIG. 5 which is a schematic view. The gas supply unit 4A is configured to be substantially similar to the plasma forming unit 3. However, in the gas supply unit 4A, the supply of microwave to the antenna 31 is not performed. Thus, plasma is not formed below the gas supply unit 4A. Further, a gas is not discharged from the gas discharge ports 41 and 42 of the gas supply unit 4A, and instead, the gas supply unit 4A has rod-shaped gas nozzles 45 and 46 at an upstream side and a downstream side of the gas supply unit 4A in the rotational direction.

The gas nozzles 45 and 46 extend from the outside of the vacuum vessel 11 toward the central portion thereof, along a radial direction of the rotary table 2 above the rotary table 2. Further, a plurality of discharge ports 47 are formed to be spaced apart from each other in the extending direction in the gas nozzles 45 and 46. The discharge ports 47 of the gas nozzle 45 are opened toward the downstream side in the rotational direction and the discharge ports 47 of the gas nozzle 46 are opened toward the upstream side in the rotational direction. The discharge ports 47 supply a gas supplied from a base end side of the gas nozzles 45 and 46 (the outside of the vacuum vessel 11) to a lower side of the gas supply unit 4A.

In the drawing, reference numeral 48 denotes an $NH_3$ gas supply source. The gas nozzle 45 and the gas nozzle 46 of the gas supply unit 4A are connected to the $H_2$ gas supply source 43 and the $NH_3$ gas supply source 48 via a piping system 50 having a gas supply device 49. The piping system 50 is configured to individually control the supply and stop and flow rate of a gas from the $H_2$ gas supply source 43 to the gas nozzle 45, the supply and stop and flow rate of a gas from the $H_2$ gas supply source 43 to the gas nozzle 46, the supply and stop and flow rate of a gas from the $NH_3$ gas supply source 48 to the gas nozzle 45, and the supply and stop and flow rate of a gas from the NH$_3$ gas supply source 48 to the gas nozzle 46.

Regarding the plasma forming unit 3 and the gas supply unit 4A, the supply and exhaust of a purge gas such as those performed in the aforementioned gas supply and exhaust unit 2 are not performed in these units. Thus, during the film forming process, the atmospheres of the plasma forming region R2 and the lower region of the gas supply unit 4A are not separated from each other. In addition, in the rotary table 12, the lower side of the gas supply unit 4A forms a second processing part in which an NH$_3$ gas is supplied to the wafer W and is physically adsorbed to the wafer W.

Figure 2:
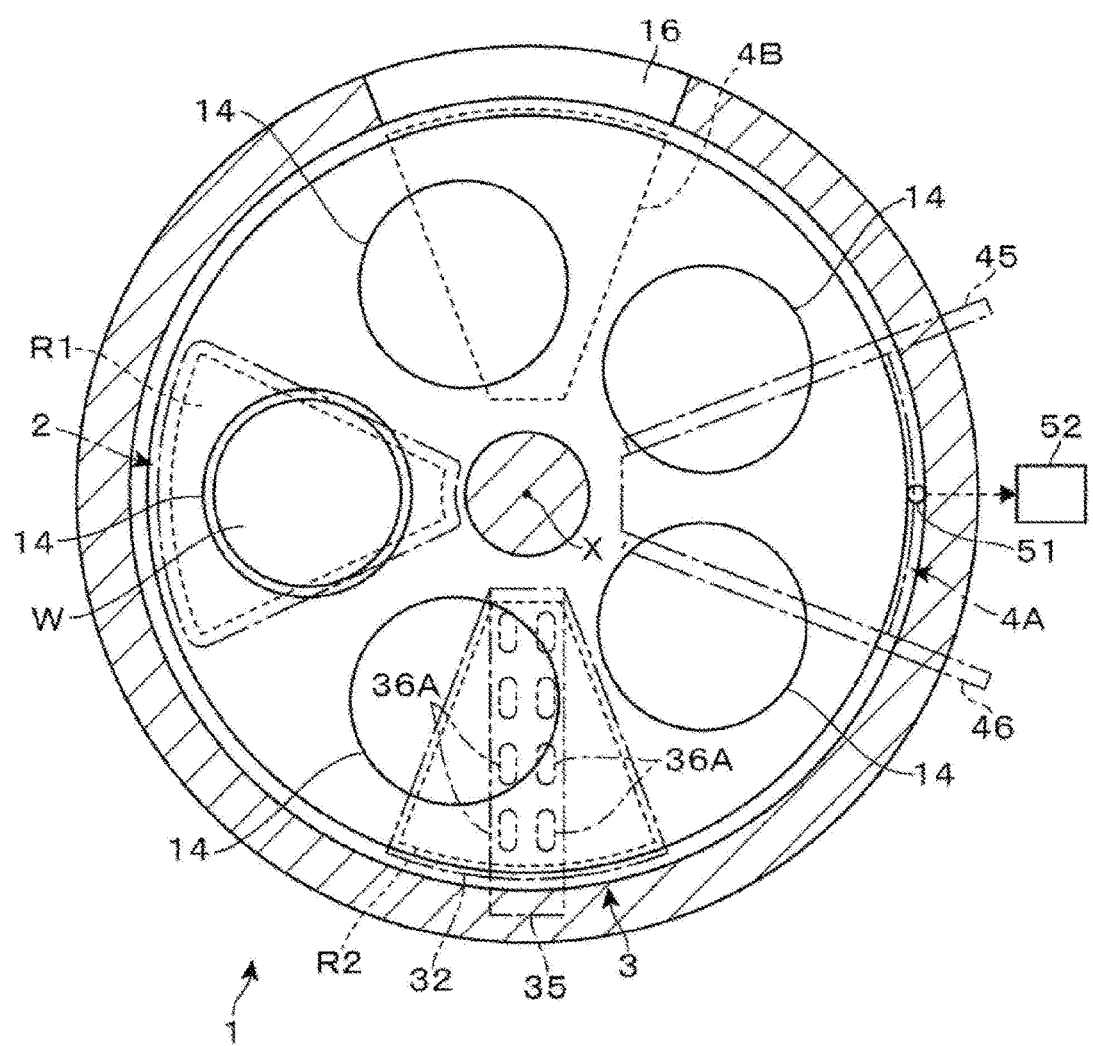
FIG. 2 is a transverse plane view of the film forming apparatus.

Further, as illustrated in FIG. 2, an exhaust port 51 is opened in a bottom portion of the vacuum vessel 11 in an outer lower side of the rotary table 12, and an exhaust device 52 is connected to the exhaust port 51. An exhaust amount from the exhaust port 51 may be adjustable by the exhaust device 52, and a vacuum atmosphere of pressure corresponding to the exhaust amount is formed within the vacuum vessel 11. Each gas discharged from the gas supply unit 4A is exhausted from the exhaust port 51. Further, a gas which is converted into plasma as soon as it is discharged by the plasma forming unit 3 and which is subsequently deactivated is also removed from the exhaust port 51.

As illustrated in FIG. 1, a control part 10 configured as a computer is installed in the film forming apparatus 1, and a program is stored in the control part 10. In the program, groups of steps are organized such that a control signal is transmitted to each part of the film forming apparatus 1 to control the operation of each part and the film forming process as described herein below is executed. Specifically, the RPM of the rotary table 12 by the rotation mechanism 13, the flow rate and supply and stop of each gas by each gas supply device, the exhaust amount by each of the exhaust devices 28 and 52, the supply and stop of microwaves from the microwave generator 37 to the antenna 31, the power feeding to the heater 15, and the like are controlled by the program. The control of power feeding to the heater 15 is the control of a temperature of the wafer W, and the control of exhaust amount by the exhaust device 52 is the control of internal pressure of the vacuum vessel 11. This program is installed in the control part 10 from a storage medium such as a hard disk, a compact disk, a magneto-optical disc, a memory card or the like.

Figure 6:
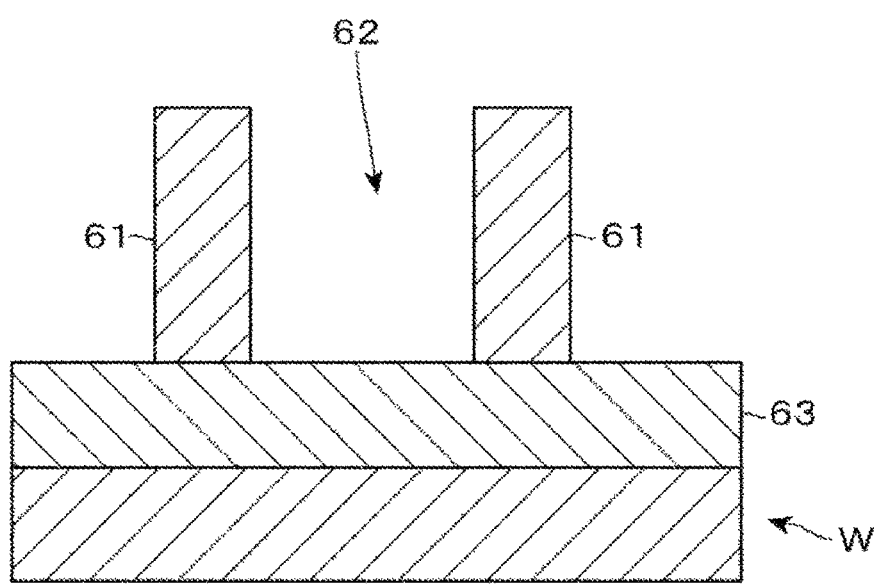
FIG. 6 is a schematic view illustrating the surface of a wafer during a film forming process.

Hereinafter, the film forming process by the film forming apparatus 1 will be described appropriately with reference to FIGS. 6 to 10 which are schematic views of a longitudinal side surface of the wafer W. FIG. 6 illustrates the wafer W immediately before performing the film forming process, and a carbon film 61 having carbon as a main component, referred to as an SOC film described in the background section, is formed on its surface. That is, the carbon film 61 is exposed on the surface of the wafer W. Further, a pattern 62 including holes or grooves is formed on the carbon film 61. In the drawing, reference numeral 63 denotes a lower layer film of the carbon film 61.

After five wafers W illustrated in FIG. 6 are transferred to the respective concave portions 14 of the rotary table 12 by the substrate transfer mechanism, the gate valve installed in the transfer port 16 of the wafer W is closed, and the interior of the vacuum vessel 11 is hermetically sealed. The wafer W loaded on the concave portion 14 is heated by the heater 15 to a temperature at which ammonia is physically adsorbed to the wafer W when the ammonia is supplied thereto as described herein below. This temperature is, for example, 150 to 650 degrees C., preferably, 450 to 650 degrees C.

Further, with exhaust from the exhaust port 51, the interior of the vacuum vessel 11 becomes a vacuum atmosphere with a predetermined pressure and the rotary table 12 is rotated at, for example, 10 to 30 rpm.

Further, in the gas supply and exhaust unit 2, a DCS gas as a raw material gas and an Ar gas as a purge gas are respectively discharged at a predetermined flow rate from the gas discharge ports 21 and 23, and are exhausted from the exhaust port 22. In addition, in the plasma forming unit 3, a plasma forming gas, which is an H$_2$ gas, is discharged at a predetermined flow rate from each of the first gas discharge port 41 and the second gas discharge port 42 and microwaves is supplied from the microwave generator 37 to form plasma in the plasma forming region R2. Further, in the gas supply unit 4A, a mixture gas of an NH$_3$ gas and an H$_2$ gas is discharged from the gas nozzles 45 and 46.

Figure 7:
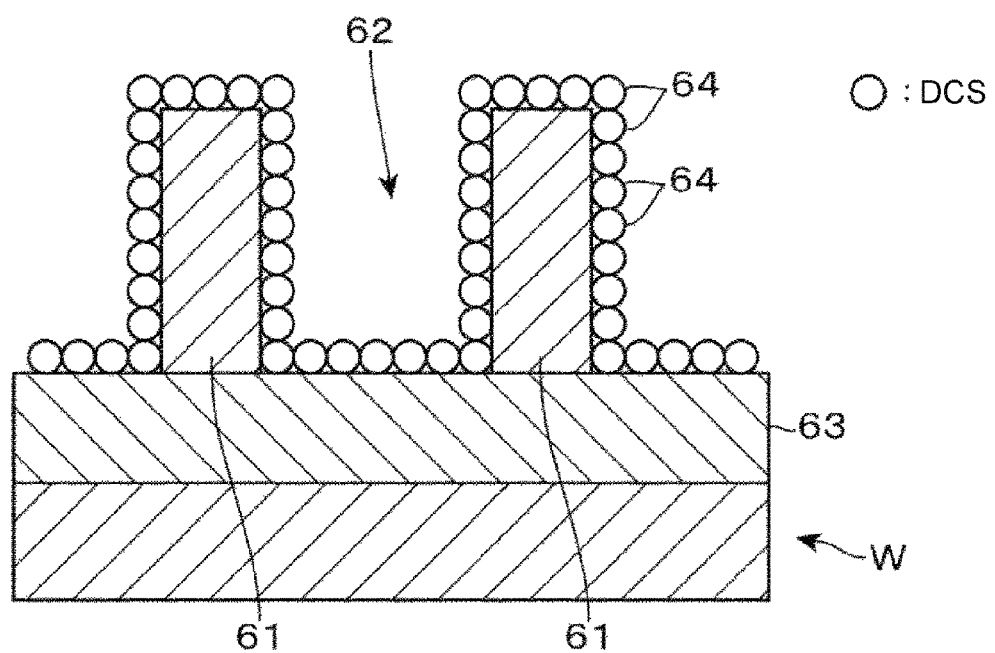
FIG. 7 is a schematic view illustrating the surface of a wafer during a film forming process.

When the wafer W is located in the raw material gas adsorption region R1 by rotation of the rotary table 12, for example, the DCS gas as a raw material gas containing silicon is supplied and adsorbed to the surface of the wafer W. In FIG. 7, the molecules of the adsorbed DCS gas are denoted by reference numeral 64. Subsequently, the rotary table 12 is rotated, the wafer W is moved toward the outside of the raw material gas adsorption region R1, and a purge gas is supplied to the surface of the wafer W to remove the DCS gas excessively adsorbed onto the wafer W.

Figure 8:
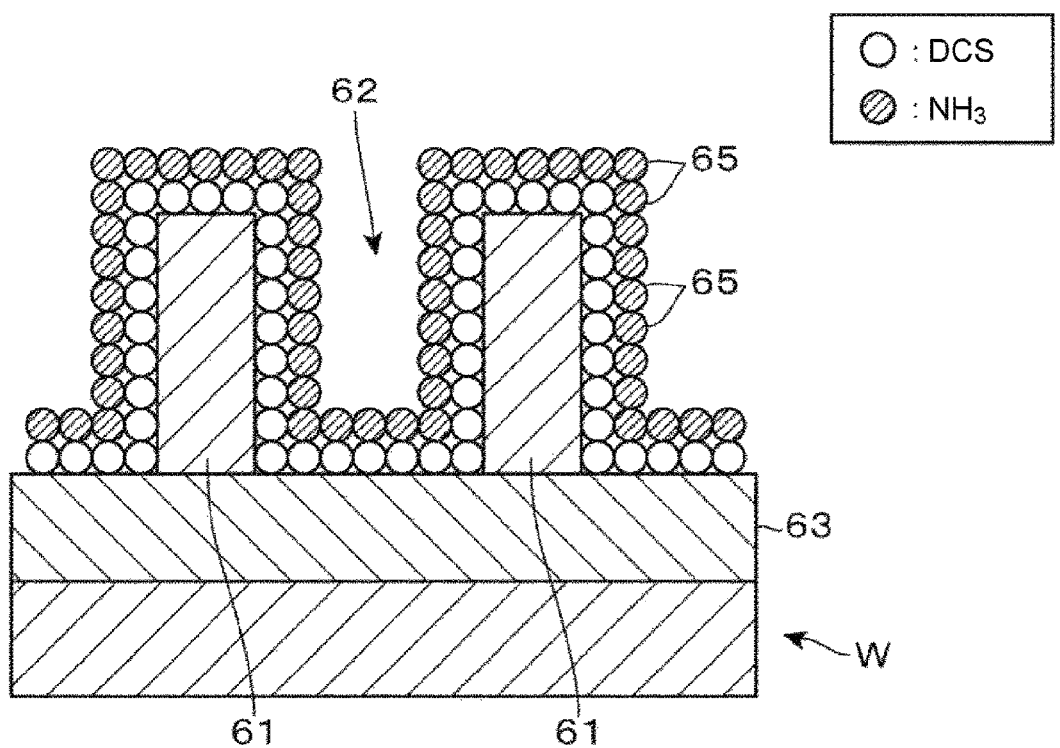
FIG. 8 is a schematic view illustrating the surface of a wafer during a film forming process.
Figure 9:
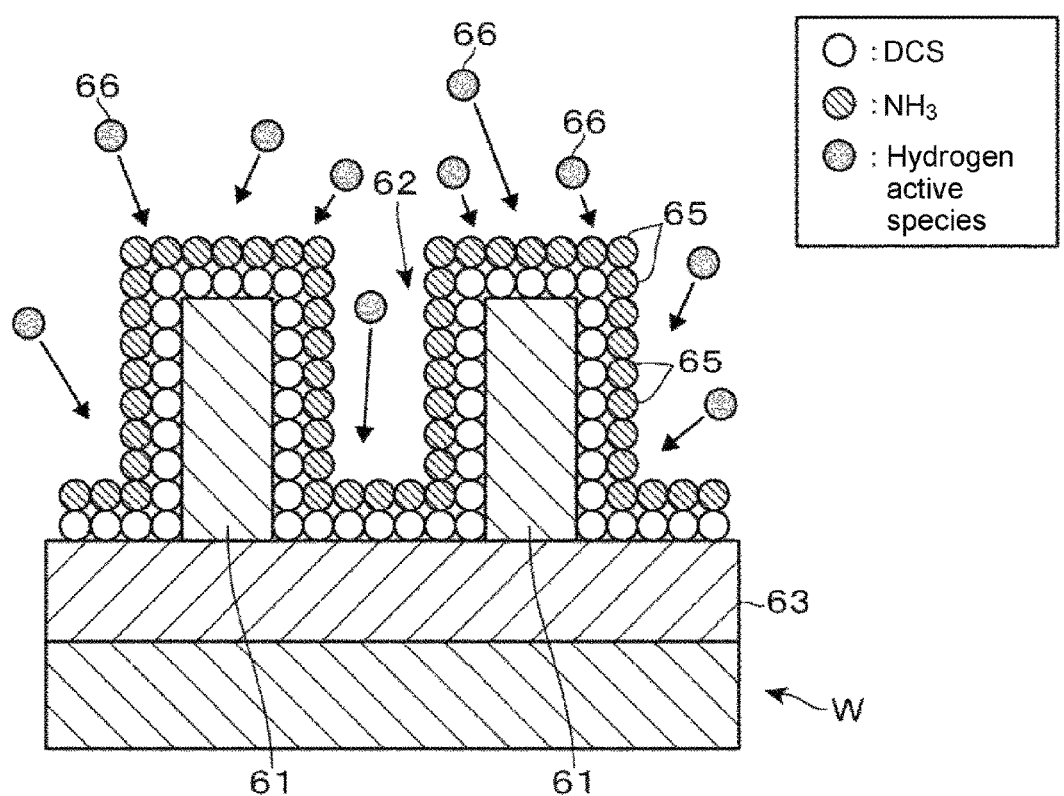
FIG. 9 is a schematic view illustrating the surface of a wafer during a film forming process.

Thereafter, the wafer W is moved to the outside of the raw material gas adsorption region R1, and when the wafer W reaches a lower region of the gas supply unit 4A, the molecules of the NH$_3$ gas supplied from the gas supply unit 4A are physically adsorbed to the surface of the wafer W. In FIG. 8, the molecules of NH$_3$ thus physically adsorbed are denoted by reference numeral 65. Since plasma is limitedly formed in the plasma forming region R2 as mentioned above, the NH$_3$ gas supplied to the wafer W is the NH$_3$ gas not converted into plasma state.

Figure 10:
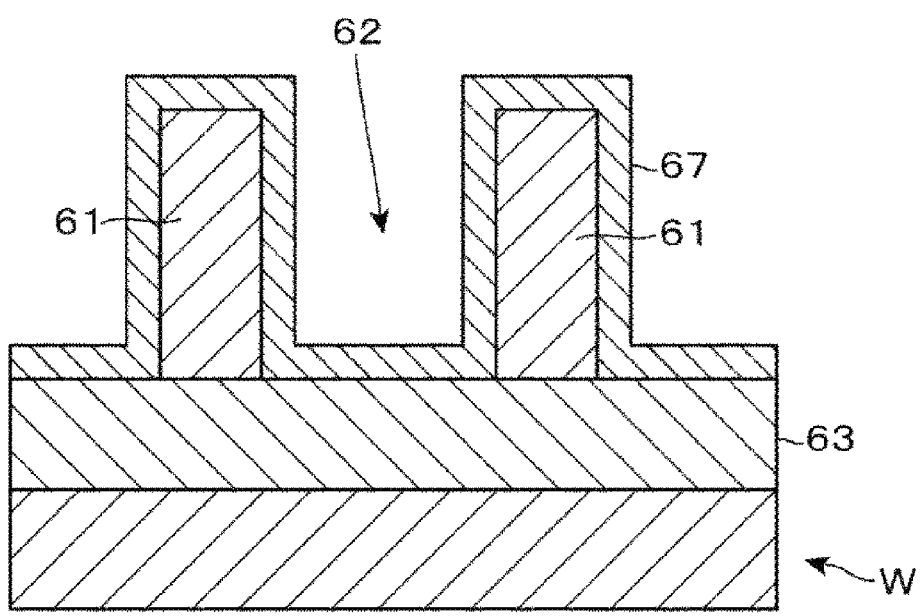
FIG. 10 is a schematic view illustrating the surface of a wafer during a film forming process.

Further, when the rotary table 12 is rotated and the wafer W is moved to the plasma forming region R2, active species (denoted by reference numeral 66 in FIG. 9) of a hydrogen gas, which form plasma, make contact with the surface of the wafer W, the NH$_3$ gas physically adsorbed to the wafer W and the DCS gas reacts with each other, and a thin layer 67 formed of SiN is formed to cover the carbon film 61 on the surface of the wafer W as illustrated in FIG. 10. In addition, since NH$_3$ is physically adsorbed to the wafer W as mentioned above, it is considered that a chemical reaction between NH$_3$ and DCS does not occur on the surface of the wafer W before the active species make contact with the wafer W, and that energy is applied to the physically adsorbed NH$_3$ by the action of the active species of hydrogen supplied to the wafer W to cause NH$_3$ to react with the DCS to form SiN.

Thereafter, the rotary table 12 is rotated and the wafer W moves again from the plasma forming region R2 toward the raw material gas adsorption region R1. The wafer W sequentially repeatedly moves in the raw material gas adsorption region R1, the lower region of the gas supply unit 4A, and the plasma forming region R2. Thus, a series of processes including the adsorption of the DCS gas, the physical adsorption of the NH$_3$ gas, and the formation of the thin layer 67 of SiN by the supply of active species generated from the H2 gas are repeatedly performed on the wafer W to deposit the thin layer 67. In this manner, the SiN film is formed by the deposition of the thin layer 67 while the film thickness of the SiN film is increased.

Thereafter, when the SiN film having a desired film thickness is formed, for example, the discharge and exhaust of each gas in the gas supply and exhaust unit 2, the supply of each gas and the supply of microwave in the plasma forming unit 3, and the discharge of each gas in the gas supply unit 4A are stopped to complete the film forming process. After the film forming process, the wafer W is unloaded from the film forming apparatus 1 by the transfer mechanism. Further, the SiN film thus formed may be processed in shape, for example, by etching after the film forming process, so that it can be used as a mask for etching the lower layer film 63.

In the film forming process using the aforementioned film forming apparatus 1, after adsorbing the DCS gas to the surface of the wafer W, the $NH_3$ gas not converted into plasma is physically adsorbed to the wafer W to allow the surface of the wafer W to make contact with the active species of the $H_2$ gas. By doing so, a thin layer of SiN film is formed by causing DCS and $NH_3$ to react with each other. Further, an SiN film is obtained by laminating the thin layer. Since nitriding is performed by activating the $NH_3$ gas thus physically adsorbed, there is no need to expose the wafer W to an atmosphere in which a large amount of the active species of $NH_3$ gas exist. Thus, it is possible to suppress the occurrence of a phenomenon in which the carbon film 61 is etched, so that the film thickness of the carbon film 61 is reduced. Further, since there is no need to use active species of the $N_2$ gas, which have a relatively short time period from its generation to deactivation, as the active species of the plasma forming gas, it is possible to enhance the coverage of the underlying film due to the SiN film. As can be seen in evaluation tests as described below, since the active species of $H_2$ gas are used as the active species of the plasma forming gas, good film quality of the SiN film can be obtained. The term "good film quality" refers to, specifically, that the film has less impurity and a dense structure. By making the film quality good, it is possible to obtain a desirable shape of the SiN film during etching.

However, when comparing with a process in which the SiN film is formed by setting the temperature of the wafer W to be a temperature higher than 650 degrees C. and chemically reacting DCS adsorbed to the wafer W with the $NH_3$ gas supplied to the wafer W, namely a process in which the SiN film is formed without relying on the action of the active species, the process of the aforementioned film forming apparatus 1 can obtain a good film quality of the SiN film. This is considered to be true because, when the active species act on the physically adsorbed $NH_3$, an impurity present on the surface of the wafer W is extracted and removed from the surface of the wafer W.

Further, in the above example, the $H_2$ gas is used alone as the plasma forming gas. However, it may be possible to use, as the plasma forming gas, a mixture of different gases such as an Ar gas, an $NH_3$ gas, a $N_2$ gas, a He gas or the like, and the $H_2$ gas.

(Evaluation Tests)

Hereinafter, evaluation tests performed according to the present disclosure will be described.

Evaluation Test 1

First, a difference between a film forming apparatus for a test used in evaluation test 1 and the film forming apparatus 1 described in the embodiment of the present disclosure will be described. In the film forming apparatus for a test, it is illustrated that the gas supply unit 4B illustrated in FIG. 2 is installed between the gas supply and exhaust unit 2 and the gas supply unit 4 when viewed in the circumferential direction of the rotary table 12. The gas supply unit 4B is configured to be similar to the plasma forming unit 3, but during testing, the formation of plasma was not performed by the gas supply unit 4B, and, in the time slot in which each gas is supplied from other unit, the supply of the $H_2$ gas from the gas discharge ports 41 and 42 formed in the gas supply unit 4B was performed.

Further, in the film forming apparatus for a test, a piping system for supplying the $H_2$ gas to the plasma forming unit 3 is different from that of the film forming apparatus 1. In the film forming apparatus for a test, the upstream sides of pipes respectively connected to the gas discharge port 41 of the gas supply unit 4B and the gas discharge port 41 of the plasma forming unit 3 join to form a first junction pipe, and the upstream side of the first junction pipe is connected to the $H_2$ gas supply source 43 via the gas supply device 44. Similarly, the upstream sides of pipes respectively connected to the gas discharge port 42 of the gas supply unit 4B and the gas discharge port 42 of the plasma forming unit 3 join to form a second junction pipe, and the upstream side of the second junction pipe is connected to the $H_2$ gas supply source 43 via the gas supply device 44. That is, each flow rate of the $H_2$ gas supplied to the first junction pipe and the second junction pipe is controlled.

In evaluation test 1, the film forming process was performed on the SiN film using the aforementioned film forming apparatus for a test, in the same manner as that of the embodiment of the present disclosure. During the film forming process, the temperature of the wafer W was set to be 450 degrees C., the internal pressure of the vacuum vessel 11 was set to be 267 Pa (2 Torr), and the supply power to the microwave generator 37 was set to be 2,500 W. Further, the flow rate of the hydrogen gas supplied to each of the first junction pipe and the second junction pipe was set to be 3,000 sccm, the flow rate of the hydrogen gas supplied to each of the gas nozzles 45 and 46 was set to be 1,000 sccm, the flow rate of the $NH_3$ gas supplied to each of the gas nozzles 45 and 46 was set to be 45 sccm, and the flow rate of the DCS gas supplied to the gas supply and exhaust unit 2 was set to be 1,200 sccm. After the film forming process, the SiN film formed on the wafer W was etched and the etching rate was measured. The etching rate is an indicator of film quality, and the smaller the etching rate is, the better the film quality is.

Comparative Test 1

In comparative test 1, the film forming process was performed in a state where the upstream sides of the first junction pipe and the second junction pipe of the film forming apparatus for a test were connected to an argon (Ar) gas supply source, instead of the $H_2$ gas supply source 43. That is, in the plasma forming region R2, the active species of the AR gas, instead of the active species of the $H_2$ gas, was supplied to the wafer W and the processing was performed such that the $NH_3$ gas physically adsorbed to the wafer W was excited. In comparative test 1, the film formation was performed on the SiN film in the same manner as that of evaluation test 1, except that the type of the supplied gas was different. Thereafter, the etching rate of the SiN film was measured.

Figure 11:
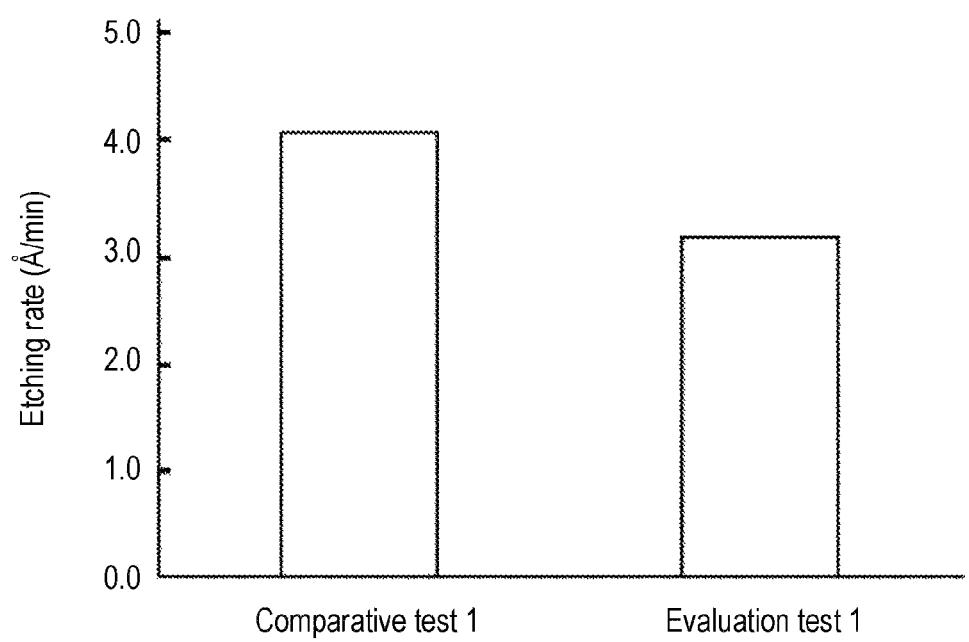
FIG. 11 is a graph illustrating the result of an evaluation test.

The bar graphs of FIG. 11 represent the results of evaluation test 1 and comparative test 1, respectively. As illustrated in the graphs, the etching rate of evaluation test 1 was 3.2 Å/min and the etching rate of comparative test 1 was 4.1 Å/min, and the quality of the SiN film of evaluation test 1 was better than that of the SiN film of comparative test 1. This is considered to be because, the active species of the $H_2$ gas can more easily excite the $NH_3$ gas physically adsorbed onto the DCS than the active species of the Ar gas and form a firmer bond between Si and N. Further, it is considered that the modification effect of the SiN film was obtained by the active species of the H$_2$ gas. Based on the results of evaluation test 1, the effects of the present disclosure were confirmed.

Evaluation Test 2

In evaluation test 2, an experiment was conducted using a film forming apparatus for a test different from the film forming apparatus used in evaluation test 1, and the film forming apparatus for a test processes wafers W one by one. In evaluation test 2-1, the wafer W was received in the vacuum vessel of the film forming apparatus for a test, the temperature of the wafer W was set to be 485 degrees C., and exhaust was performed such that the internal pressure of the vacuum vessel became 267 Pa (2 Torr). Thereafter, the SiN film was formed on the wafer W within the vacuum vessel by an ALD method. Specifically, the film formation was performed by repeating a cycle which sequentially performs the supply of a DCS gas, the supply of a purge gas, the supply of an NH$_3$ gas, the supply of a purge gas, and the supply of an Ar gas converted into plasma, 200 times. In one cycle, a purge gas was supplied between the supply of the NH$_3$ gas and the supply of the Ar gas for 12 seconds and each of other gases was supplied for 6 seconds. After the film formation, the film thickness of the wafer W was measured.

In evaluation test 2-2, the SiN film was formed on the wafer W under the same conditions as those of evaluation test 2-1, except that the supply time period of the NH$_3$ gas in one cycle was set to be 30 seconds, and the film thickness was measured. In evaluation test 2-3, the SiN film was formed on the wafer W under the same conditions as those of evaluation test 2-1, except that an Ar gas not converted into plasma, instead of an Ar gas converted into plasma, was supplied, and the film thickness was measured.

Figure 12:
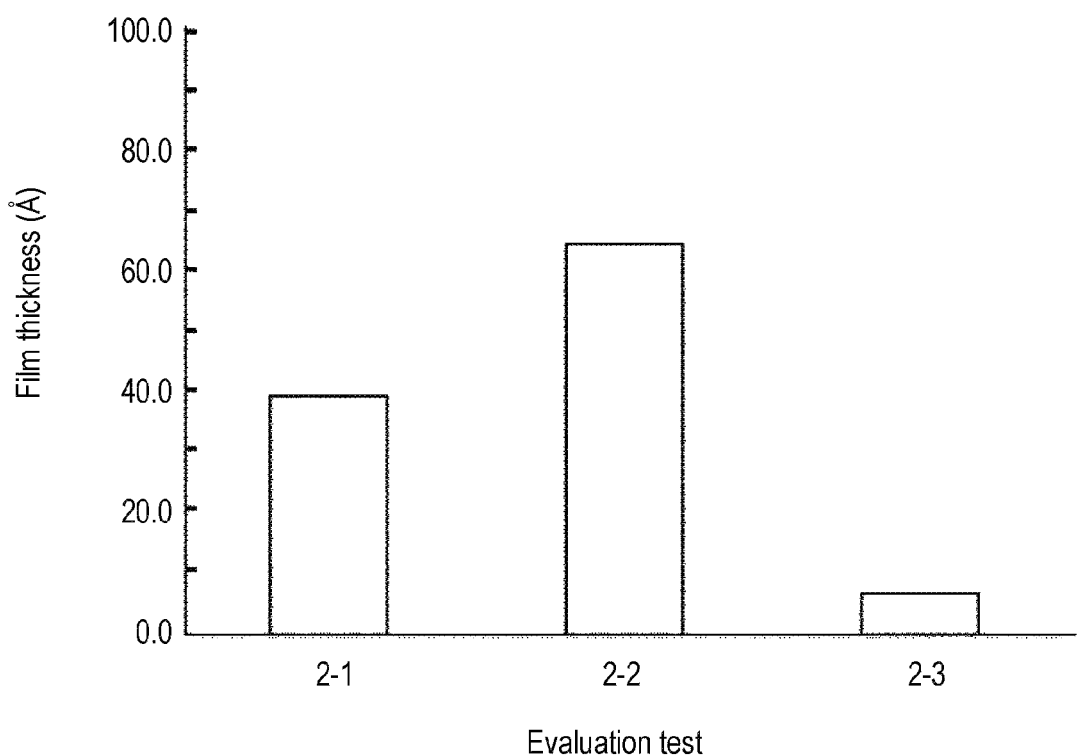
FIG. 12 is a graph illustrating the result of an evaluation test.

The bar graphs of FIG. 12 represent the film thicknesses of the SiN films respectively measured in evaluation tests 2-1 to 2-3. The film thickness of evaluation test 2-1 was 39.0 Å, the film thickness of the evaluation test 2-2 was 64.5 Å, and the film thickness of the evaluation test 2-3 was 6.3 Å. In evaluation test 2-2 in which the supply time period of the NH$_3$ gas was long in one cycle compared with evaluation test 2-1, the film thickness was large. Further, in evaluation test 2-3 in which the active species of plasma were not supplied, the film thickness was smaller than those of evaluation tests 2-1 and 2-2 in which the active species of plasma was supplied. From the results of evaluation test 2, as described in the embodiment of the present disclosure, it is supposed that the NH$_3$ gas supplied to the wafer W was in a state in which it does not chemically react with the DCS of the surface of the wafer W but is physically adsorbed, and the film formation was performed as such chemical reaction occurs by the action of the active species of plasma. That is, from evaluation test 2, it was confirmed that, by setting the appropriate conditions, the NH$_3$ gas can be physically adsorbed to the wafer W to which the DCS gas was supplied.

Evaluation Test 3

In evaluation test 3, the film forming process of SiN was performed on the wafer W using the film forming apparatus for a test described in evaluation test 1 a plurality of times. In each film forming process, the temperature of the wafer W was set to be 450 degrees C., the internal pressure of the vacuum vessel 11 was set to be 267 Pa (2 Torr), and the output of the microwave generator 37 was set to be 2,500 W. Thereafter, in each film forming process, a mixture of an NH$_3$ gas and a different gas was supplied as the plasma forming gas to the plasma forming region R2, and other gases were changed in every film forming process. Specifically, an H$_2$ gas, an Ar gas, or a helium (He) gas was used as the different gas. The flow rate of the NH$_3$ gas supplied to the plasma forming region R2 was adjusted to 750 sccm and the flow rate of the different gas supplied to the plasma forming region R2 was adjusted to 4,000 sccm.

After the film formation, etching was performed on one of the wafers W which used an H$_2$ gas as a different gas without performing an annealing process. An annealing process was performed and etching was subsequently performed on another wafer. Also, with respect to the wafers W which used an Ar gas and a He gas as the different gas, respectively, etchings were performed without an annealing process and after an annealing process, similar to the wafer W which is processed using the H$_2$ gas. After the etching, the etching rates of the SiN film were measured.

Figure 13:
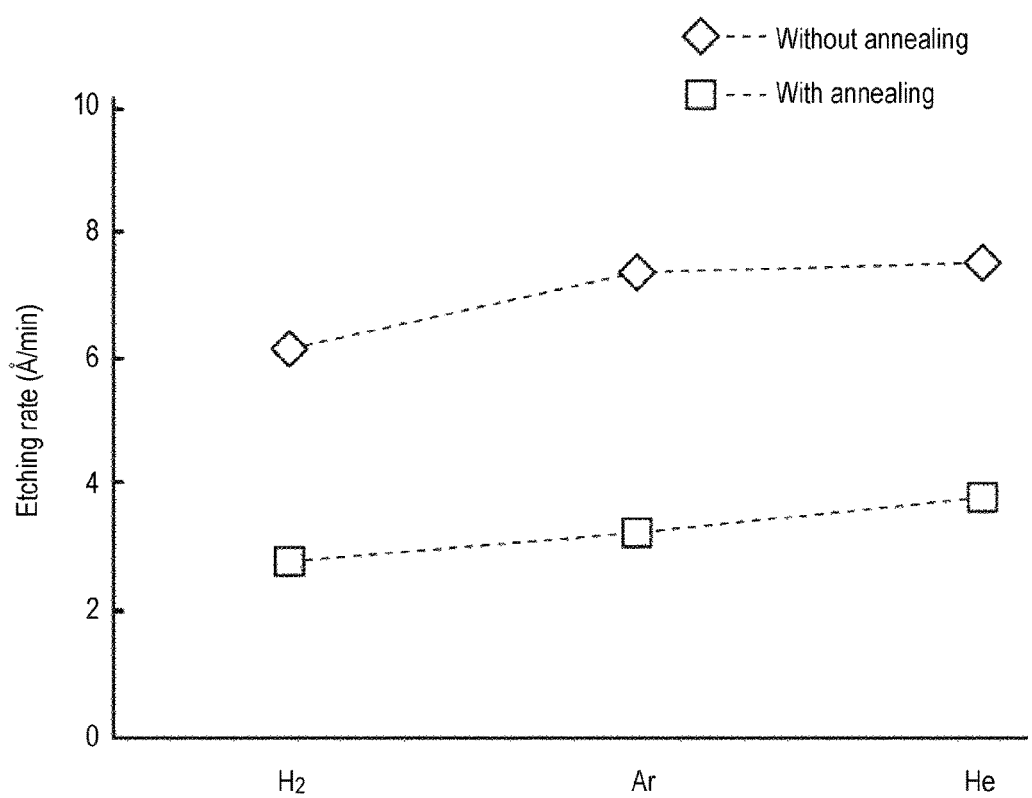
FIG. 13 is a graph illustrating the result of an evaluation test.

The graphs of FIG. 13 show the etching rates of the used gases for a case where the annealing was performed and a case where the annealing was not performed. When the annealing was performed to the wafer W using a H$_2$ gas and when the annealing was not performed, the etching rates were 6.2 Å/min and 2.7 Å/min, respectively. When the annealing was performed on the wafer W using the Ar gas and when the annealing was not performed, the etching rates were 7.4 Å/min and 3.2 Å/min, respectively. When the annealing was performed on the wafer W using the He gas and when the annealing was not performed, the etching rates were 7.5 Å/min and 3.8 Å/min, respectively. That is, in both cases where the annealing was performed and the annealing was not performed, the etching rates of the wafers W which used the H$_2$ gas as the plasma forming gas were lower than the etching rates of the wafers W which used the Ar gas or the He gas as the plasma forming gas. In other words, from evaluation test 3, it was confirmed that the quality of the SiN film was enhanced when using the H$_2$ gas as the plasma forming gas, thereby achieving the effects of the present disclosure.

Evaluation Test 4

Evaluation test 4, which is a reference test, is illustrated. In evaluation test 4, the SiN film was formed using a film forming apparatus configured to be substantially similar to that in evaluation test 1. However, the gas supply units 4A and 4B supplied a mixture of an Ar gas and an NH$_3$ gas, and the plasma forming unit 3 supplied a mixture of an N$_2$ gas and an Ar gas, instead of H$_2$ gas, as the plasma forming gas. The RPM of the rotary table 12 was set to be 30 rpm, the internal pressure of the vacuum vessel 11 was set to be 267 Pa (2 Torr), and the supply power to the microwave generator 37 was set to be 2,500 W during the film forming process. The temperature of the wafer W was set to be 435 degrees C. That is, in evaluation test 4, the processing was performed such that an NH$_3$ gas was physically adsorbed to the wafer W and the NH$_3$ gas was excited using the active species of an Ar gas or an N$_2$ gas.

Figure 14:
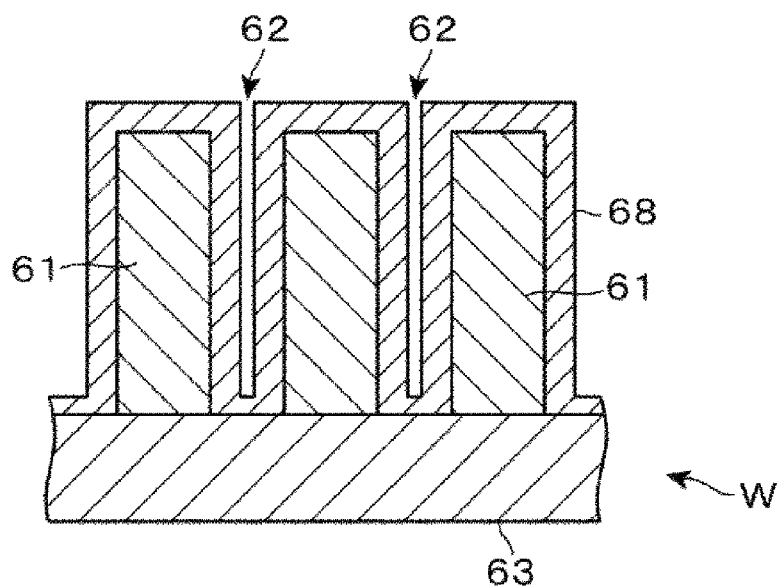
FIG. 14 is a schematic longitudinal side view of a wafer formed in an evaluation test.

An image showing a longitudinal side surface of the wafer W having been subjected to a film formation process in this manner was obtained by a scanning electron microscope (SEM). FIG. 14 illustrates the obtained image as a schematic view. As illustrated in FIG. 14, an SiN film 68 having a relatively high uniform film thickness of each portion was formed on the carbon film 61. That is, a difference in film thickness of the SiN film 68 between an upper side and a lower side of a sidewall of the carbon film 61 forming a pattern was suppressed. Further, the carbon film 61 has a sufficient film thickness. That is, the etching of the carbon film 61 was suppressed. Even in a case where the processing is performed by the active species obtained by converting the H$_2$ gas into plasma as in the embodiment of the present disclosure, similar to evaluation test 4, the SiN film is formed as the NH$_3$ physically adsorbed to the wafer W was excited. That is, it is considered that, even though the types of used active species are different, since the SiN film is formed by the same mechanism as that of evaluation test 4, the SiN film 68 having desirable coverage as illustrated in FIG. 14 can be formed.

According to some embodiments of the present disclosure, a silicon raw material gas is adsorbed to a substrate and an ammonia gas is subsequently supplied to the substrate such that it is not converted into plasma but physically adsorbed. Thereafter, active species obtained by converting a hydrogen gas into plasma is supplied to the substrate. Thus, it is possible to form a silicon nitride film having a desirable film quality on the surface of the substrate such that it can have relatively high coverage with respect to the surface of the substrate and suppress damage to the surface of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon nitride film on a substrate in a vacuum vessel, comprising:
    forming the silicon nitride film by depositing a layer of reaction product by repeating a cycle a plurality of times, the cycle including:
    a first process of supplying a gas of a silicon raw material to the substrate to adsorb the silicon raw material to the substrate;
    subsequently, a second process of supplying a gas of ammonia in a non-plasma state to the substrate to physically adsorb the gas of the ammonia to the substrate; and
    subsequently, a third process of supplying active species obtained by converting a plasma forming gas containing a hydrogen gas for forming plasma into plasma to the substrate and causing the ammonia physically adsorbed to the substrate to react with the silicon raw material to form the layer of reaction product,
    wherein the silicon nitride film is formed so as to cover a carbon film on the substrate in which a pattern of the carbon film is exposed on a surface of the substrate.

2. The method of claim 1, wherein the second process comprises heating the substrate to 150 to 650 degrees C. in order to physically adsorb the gas of the ammonia.

3. The method of claim 1, further comprising revolving the substrate loaded on a rotary table installed in the vacuum vessel,
    wherein the first process comprises supplying the gas of the silicon raw material to a first processing part in a passing region of the substrate on the rotary table,
    the second process comprises supplying the gas of the ammonia in a non-plasma state to a second processing part located at a downstream side of the first processing part in a rotational direction of the rotary table in the passing region of the substrate, and
    the third process comprises supplying the active species to a third processing part located at a downstream side of the second processing part in the rotational direction of the rotary table in the passing region of the substrate, and
    wherein the method comprises separating the second processing part and the third processing part from the first processing part in order to suppress gases from being mixed.

4. An apparatus for forming a silicon nitride film on a substrate, comprising:
    a rotary table installed in a vacuum vessel and configured to revolve the substrate;
    a first processing part configured to supply a silicon raw material gas to a passing region of the substrate above the rotary table;
    a second processing part located at a downstream side of the first processing part in a rotational direction of the rotary table and separated from the first processing part in order to suppress gases from being mixed, and configured to supply an ammonia gas in a non-plasma state to the passing region of the substrate to physically adsorb the ammonia gas to the substrate; and
    a third processing part located at a downstream side of the second processing part in a rotational direction of the rotary table and separated from the first processing part in order to suppress gases from being mixed, and configured to supply active species obtained by converting a plasma forming gas containing a hydrogen gas for forming plasma into plasma to the passing region of the substrate,
    wherein the silicon nitride film is formed so as to cover a carbon film on the substrate in which a pattern of the carbon film is exposed on a surface of the substrate.

* * * * *